United States Patent [19]
Farmer

[11] 3,968,883
[45] July 13, 1976

[54] COLLAPSIBLE JUNCTION SUPPORT BRACKET

[75] Inventor: Marion R. Farmer, Memphis, Tenn.

[73] Assignee: Aluma-Form Inc., Memphis, Tenn.

[22] Filed: Mar. 28, 1974

[21] Appl. No.: 455,540

[52] U.S. Cl. ................................ 211/201; 211/26; 317/99
[51] Int. Cl.² ........................................... H02B 1/02
[58] Field of Search ................. 211/178 R, 26, 182, 211/183, 177, 176, 103; 317/99, 103

[56] References Cited
UNITED STATES PATENTS

| | | | |
|---|---|---|---|
| 69,349 | 10/1867 | King et al. | 211/178 R |
| 661,645 | 11/1900 | Rogers | 211/175 X |
| 784,035 | 3/1905 | Connard | 211/178 R |
| 1,407,912 | 2/1922 | Bates | 211/178 R |
| 1,749,252 | 3/1930 | Leblond | 211/26 |
| 2,305,629 | 12/1942 | Magnuson | 211/178 R |
| 2,345,650 | 4/1944 | Attwood | 211/182 X |
| 2,784,812 | 3/1957 | Kindorf | 211/182 X |
| 3,221,893 | 12/1965 | Glaberson et al. | 211/103 |
| 3,508,666 | 4/1970 | Schwengel | 211/176 |
| 3,760,232 | 9/1973 | Swindell | 327/99 |

Primary Examiner—James T. McCall
Assistant Examiner—Robert W. Gibson, Jr.
Attorney, Agent, or Firm—Paul M. Denk

[57] ABSTRACT

In a collapsible junction support bracket, a series of frameworks, vertically disposed, are pivotally mounted to each other through the agency of a series of side stringers, and braces also connect laterally of the bracket for holding it erect, as when assembled, but said braces are removable to provide for collapsing of the bracket to facilitate its shipment.

6 Claims, 9 Drawing Figures

COLLAPSIBLE JUNCTION SUPPORT BRACKET

BACKGROUND OF THE INVENTION

This invention relates generally to a junction support bracket, but more particularly pertains to such a bracket which is collapsible to compact it for shipment.

Many styles of junction support brackets are available in the prior art. These brackets are useful for supporting various types of electrical equipment, such as elbows, electrical connectors, or the like, and are generally designed of various shapes and rigidly connecting structural members to create a framework that is ready for permanent installation. And, some of these brackets are tiered, so as to dispose a series of vertically arranged surfaces to which various types of junctions, such as that which contain electrical elbows, may be mounted. By way of information, these brackets are generally used where high power distribution is required, as for example from a transformer which induces single or multiphase potential, as is used in high rise buildings, shopping center complexes, or perhaps industrial installations. Heretofore, such brackets were, and are still, usually constructed of structural members into a rigid framework, and thus, in that manner, are rather difficult to transfer to the site of use, or even in those embodiments where the bracket may be shipped disassembled, it requires a time consuming assembly at the location where it is to be used. The present invention enhances upon the structiural features of such junction brackets as contained in the prior art, by being assembled almost entirely from an especially designed structural angle formation which may be precut and preassembled into the form of the bracket intended for end use, and is yet collapsible so that it may be shipped in a condensed state and then simply unfolded into the form of the bracket intended for final use and then rigidified for permanent installation.

It is, therefore, the principal object of this invention to provide a junction support bracket which is collapsible into a configuration that provides for its compaction as when it is shipped from either the site of its manufacture or warehousing, and to its destination for final installation.

It is a further object of this invention to provide a junction bracket which can be erected and permanently mounted at the location of usage within a very short period of time, having the various junctions quickly attached to its arranged structural components for immediate installation of the operating electrical components.

It is a further object of this invention to provide a junction support bracket which can be quickly disassembled and packaged into a compact arrangement in the event that it requires further shipment to another location.

An additional object of this invention is the provision of a bracket that is entirely fabricated from a minimum of similar components and capable of assembly at the plant, thereby reducing construction site labor costs.

Another object of this invention is to provide a structural member generally formed as a channel and having an integral flange which can accommodate its fabrication into various types of electrical equipment mounts, providing convenience in the interconnection of the cut components together when assembled into a mount, and yet furnish means for properly securing other electrical components, such as junctions, thereto.

These and other objects of this invention will become more apparent to those skilled in the art upon reviewing the following summary, and the description of the preferred embodiment in view of its drawings.

SUMMARY OF THE INVENTION

This invention contemplates an improvement upon an existing junction support bracket of the type that is generally utilized at locations where power distribution generally from a transformer is made to other locations. As an example, such brackets customarily have been utilized in high-rise building skyscrapers, one such bracket generally being located to provide for distributions to one or more adjacent levels or floors of a building, receiving the high voltage from a transformer which may be located on one of the particular floors, or perhaps even from a power room that may be located either on top or at the sub-level of the building. These brackets are generally useful for distributing three phase power, but they may also be utilized for distributing single phase power.

Another example of the extended usage of these type brackets is their placement at various industrial installations, or in larger shopping complexes, where significant power distribution is required. In any event, regardless of the end use of the junction support brackets of these various types, they must be manufactured, assembled, and shipped to the construction site where they will be utilized, and such shipment can be of some added cost, due to their bulk, which obviously increases the overall price of the items.

The present invention is designed to lend some portability to junction support brackets of the type generally identified, and includes one or more frameworks that are formed of various structural components, being vertically arranged, and designed for having attached thereto the various types of junctions that may include electrical elbows, connectors or the like, so as to mainly provide means for reception and distribution of electrical power to other locations. These frameworks are generally tiered to their construction, with the forwardmost framework having a mounting surface which is disposed for reception of an electrical junction, and which surface is arranged generally below the similar type mounting surfaces that are formed of the frameworks disposed there behind. In three-phase distribution, there are generally three tiers of these mounting surfaces formed as three vertically arranged frameworks, and these frameworks are secured together by a series of stringers that connect with the side portions of the pairs of structural members that form each framework. These stringers are generally loosely or pivotally mounted to each framework, so that, as when it becomes necessary, the various frameworks may be pivoted with respect to each other and collapsed into a more flattened structure, which makes it highly convenient for transportation to a location of use. And, when the bracket does arrive at the site where it is to be installed, it can simply be unfolded and erected into its operative position, with the stabilizing braces attached to the side portions of its structural framework to rigidify it in this erected and equipment supporting position.

Another unique feature of this invention is the design of the actual structural member utilized in the fabrication of almost all of the components of this bracket. This structural member is a form of structural angle that is arranged having a channel-like portion, and with a flange integrally formed and extending from the back side of the said channel. Among the desirable features of this structural member is that the flange portion provides a planar surface which can conveniently be mounted to other structures, or a structure of the same shape, and in addition, the opening of the designed channel can conveniently accommodate the head of a bolt or other fastening means for allowing other components, such as electrical members, to be secured to this type of a structural member.

DESCRIPTION OF THE PREFERRED EMBODIMENT

Figure 1:
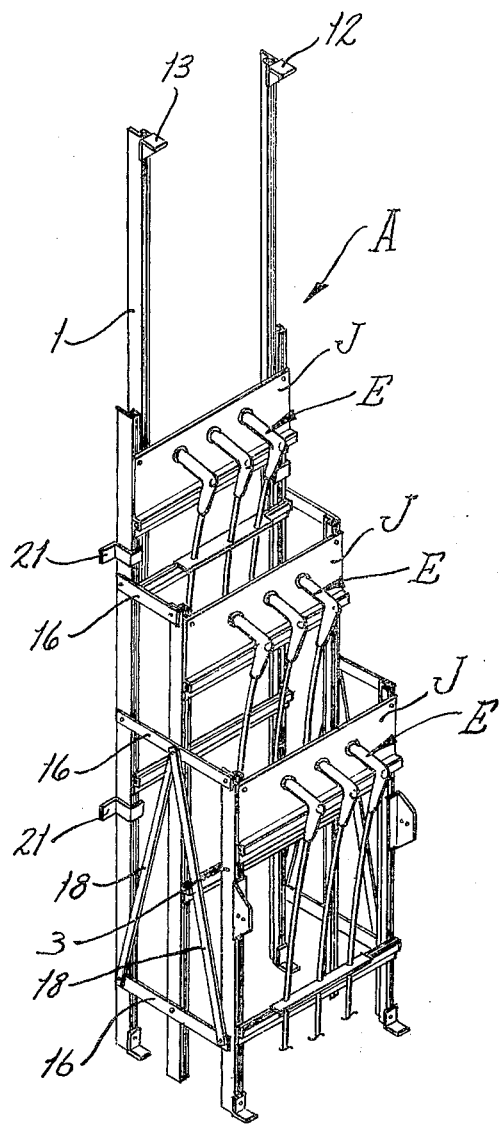
FIG. 1 provides a perspective view of an installed collapsible junction support bracket of this invention.

In the drawings, and in particular FIG. 1, there is shown the collapsible junction support bracket A of this invention. This bracket is designed for accommodating and mounting various types of electrical components, such as the electrical elbows E shown attaching to the usual junction J that generally is included with such elbows when shipped from their manufacturer. Such junctions usually are in the form of some type of metallic structural brace that spans the distance between the frame members of brackets of this type, and also are accompanied with some form of board upon which various information depicting the style and type of electrical characteristics of the components.

Figure 4:
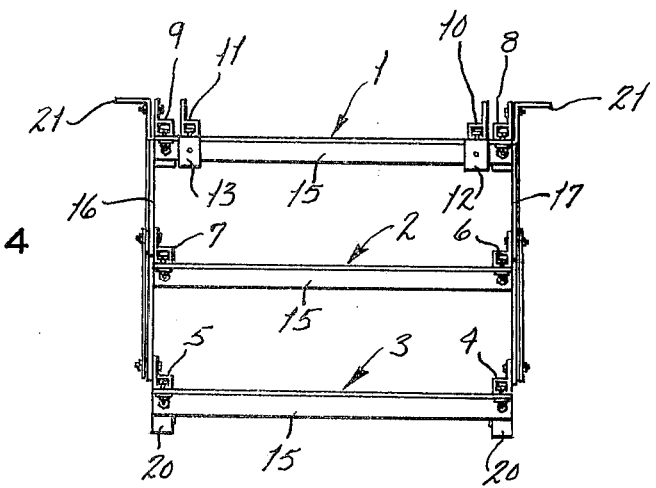
FIG. 4 provides a top view of the bracket shown in FIG. 2.
Figure 2:
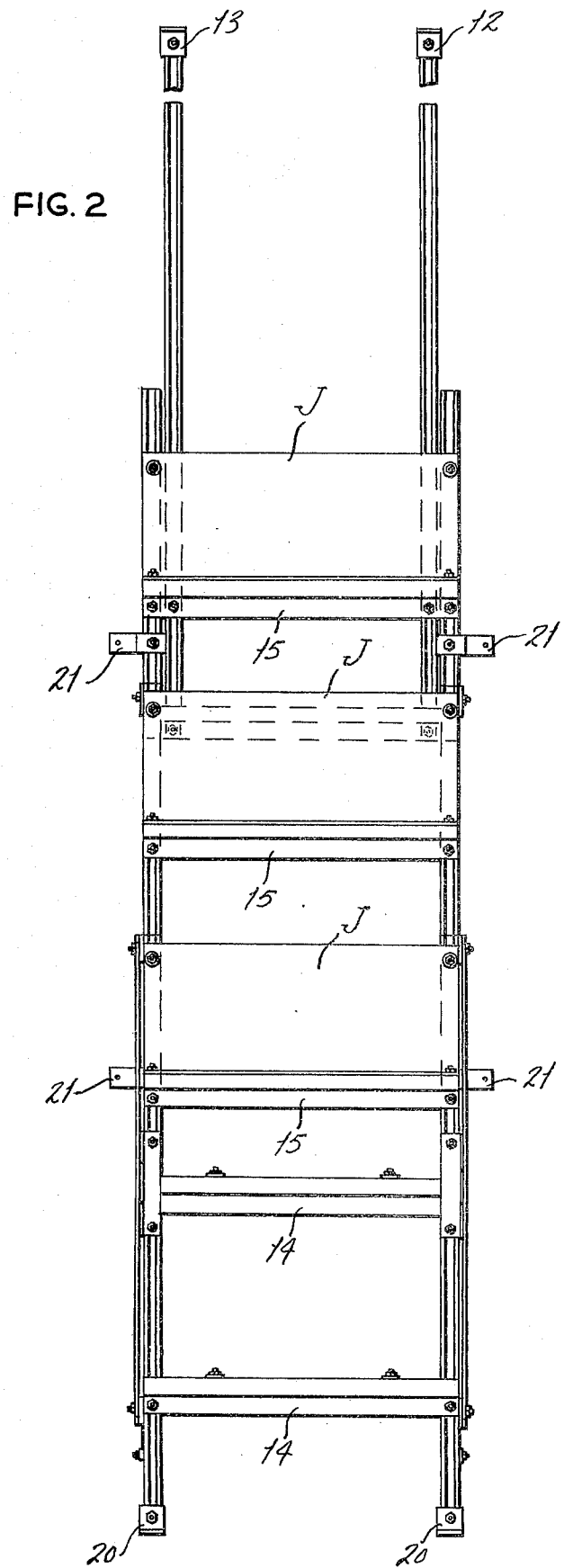
FIG. 2 provides a front view of the bracket as shown in FIG. 1, with the electrical elbows as being removed therefrom.
Figure 3:
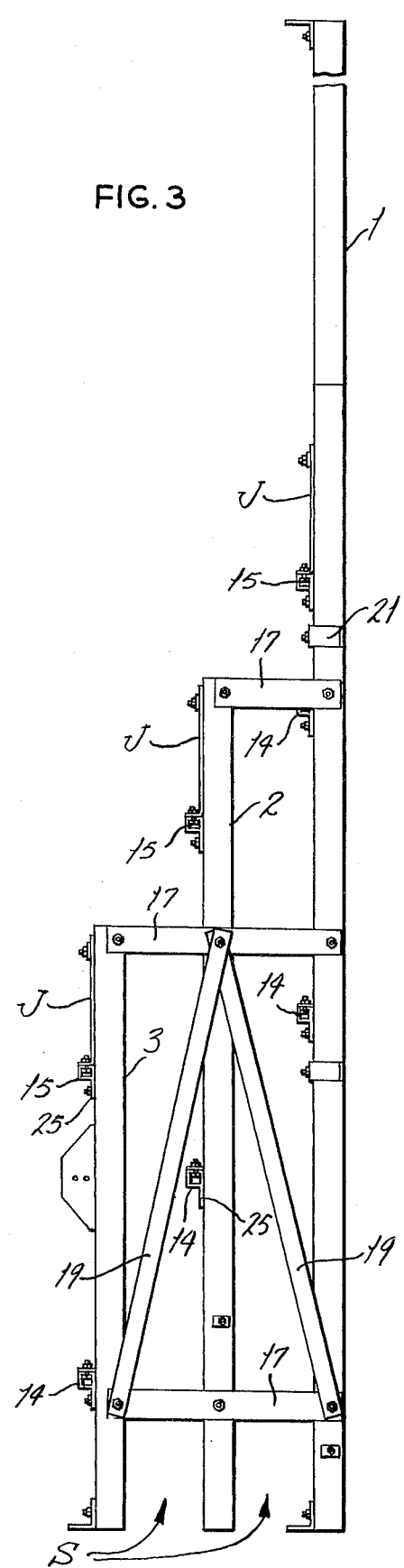
FIG. 3 provides a side view of the bracket shown in FIG. 2.

The junction support bracket of this invention is further disclosed in detail in FIGS. 2 through 4, and in its various front, side and top views, and in this particular instance comprises a three tiered bracket having three vertically disposed frameworks 1, 2, and 3 that arrange spaces at various heights to accommodate the mounting of the aforesaid electrical junctions in conveniently exposed levels. Each framework of this bracket is generally constructed comprising a pair of spaced apart structural members, such as members 4 and 5 in framework 3, members 6 and 7 in framework 2, and members 8 and 9 within the framework 1.

These pairs of structural members are generally spaced apart a distance of about 2 feet, to provide convenient width for accommodating the standard type of junctions J that are presently manufactured. The framework 1 may be extended height-wise by the addition of another pair of structural members, as at 10 and 11, if additional height is required, and particularly if it is convenient to stabilize the upward portion of the bracket by attaching it to the ceiling, as through the use of the structural angles 12 and 13, as shown.

Each framework also includes a series of lower transverse support members 14 which are designed for stabilizing the bracket laterally, and in addition, each framework further includes the upper transverse support member 15 which has the dual purpose of also rigidifying its structure laterally, but in addition, may be useful for assisting in the mounting of a junction J when installed to its respective framework.

To rigidify this bracket along its depth dimension, there are included attaching to the proximate and aligned sides of the structural members of each framework a series of stringers 16 and 17 that are capable of pivoting the various frameworks either closer to, or away from, each other depending upon whether it is desired to be collapsed for shipment, or have its frameworks spaced apart as when the bracket is erected for use. And, when the bracket is readied for installation, and its frameworks each spaced apart the distance S, as shown in FIG. 3, then races 18 and 19 may be mounted in a structurally rigidifying position generally upon an incline to the sides of the frameworks, for containing them in their erected position and for operatively supporting their respective electrical components.

Figure 5:
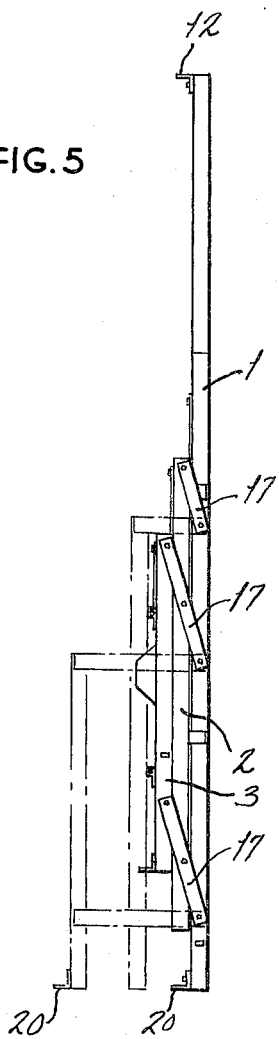
FIG. 5 discloses the bracket of this invention being disposed in its collapsed formation, and also shows in the hidden-line outline the arrangement of the front two frameworks of this bracket as when unfolded into its operative state.
Figure 6:
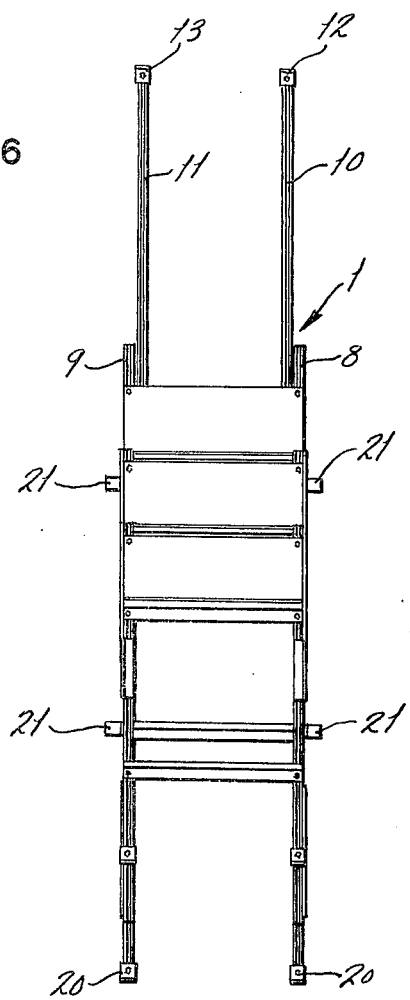
FIG. 6 provides a front view of the collapsed bracket as shown in FIG. 5.

On the other hand, when the bracket is readied for shipment, these braces 18 and 19 may be removed, by a simple removal of the fastenings securing their ends to the various frameworks as shown, and the entire bracket can then be collapsed in the manner as shown in FIGS. 5 and 6.

As seen in FIGS. 5 and 6, the junction support bracket when prepared for shipment has its braces 18 and 19 removed from its sides, and in this manner the series of stringers 17 and 16, each being reasonably parallel mounted with respect to each other, provide for the pivotal shifting of the various frameworks 1, 2 and 3 closer with respect to each other. Hence, the bracket is substantially reduced in depth from its usual installation configuration, as also shown in hidden line in FIG. 5, thereby significantly reducing its bulk, to less than one-half, and adding some convenience to the transporting of the bracket. One such example of this bracket convenience can be seen as it is being conveyed up a series of flights of floors particularly when these brackets are utilized in high rise construction.

Furthermore, and to further facilitate the transfer of this device, the upper structural members 10 and 11 of the framework 1 may be disengaged from, or at least loosened in their mounting with respect to, the lower structural members 8 and 9, or from the transverse supports, to thereby reduce the height of this bracket during movement, or to raise it during installation. Simple fastening means in the nature of bolts, etc., are used to secure these supports 8 through 11 together, and through the removal of these fastening means the structural members may be disengaged from their respective lower member.

It should be noted from the various drawings that in addition to there being structural angles 12 and 13 mounted to the top portion of the members 10 and 11, for the purpose of securing the bracket to the ceiling structure, other forms of structural angles, such as at 20, may be connected to the floor proximate ends of the various structural members for mounting of the bracket to the ground. In addition, other angled brackets, as at 21 may connect with the vertically arranged structural members 8 and 9 of the rear framework 1 to provide for mounting of the entire bracket to the wall against which it is arranged.

Figure 7:
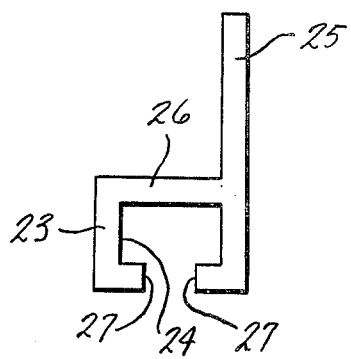
FIG. 7 provides a sectional view of the preferred structural shape utilized in the construction of both the side members and front support components of this bracket.
Figure 8:
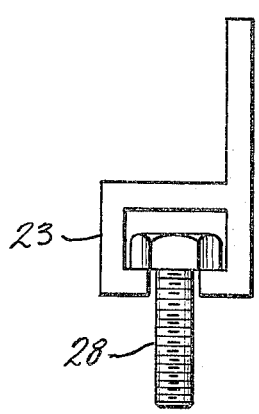
FIG. 8 discloses a similar cross-sectional view of the structural shape as shown in FIG. 7, but also disclosing the embraced head of a bolt within the opening of its formed channel.
Figure 9:
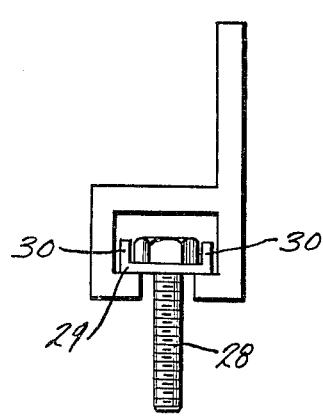
FIG. 9 provides a view similar to the structural shape shown in FIG. 8, but with the addition of a locking member through which a bolt inserts and is stationarily retained within the opening of the channel of the said structure.

FIGS. 7 through 9 disclose, in cross-section, the type of structural shape utilized in forming most of the components of this bracket. This is not to say that the bracket of this invention is only to be constructed of the type of structural shape shown in these figures, but it has been found that designing the structural members of the bracket in this manner provides convenient surfaces and channels that facilitate the interconnection of the various components of this bracket together, in addition to allowing the electrical junctions to be mounted thereto. As shown in FIG. 7, the structural shape comprises an angled member 22 which is formed having an integral channel 23 formed at one end, with its opening 24 being disposed in one direction, while a flange 25 extends in the opposite direction from thw web portion 26 of the channel, said flange being aligned with one side of the channel as shown. The channel 23 at its opening is formed having inwardly turned lips, as at 27, and these are arranged for providing retention of the head of the fastening bolt means, such as the one shown at 28, which furnishes convenience in the securement of members to a structural component after fabrication of this bracket. In addition, and to further add to the convenience in the use of structural members formed from this type of structural shape 22, a locking member 29 may be snugly fitted within the opening 24 of the channel 23, resting against the lips 27, having the bolt 28 disposed therethrough, and in this manner the head and the bolt will be reasonable flush with the sides 30 of the lock so as to prevent a turning of the bolt as a nut is being fastened thereto. As can be seen from the various figures of the drawings of this invention, the structural members 4 through 11 are fabricated from the type of structural shape shown in FIGS. 7 through 9, and in addition, the various transverse upper and lower support members 14 and 15 spanning the distance between the aforesaid structural members are also fabricated from like stock. In the erection of the structural members, the channel openings 24 of the structural shape are directed forwardly in the embodiment. Hence, the various fastening means, such as the bolts shown throughout the bracket of this invention, are conveniently mounted within these openings of the structure as shown, and readily expose their threaded shank portions for attachment through a flange, such as typically illustrated at 25, of the various transverse supports 14 and 15 that connect with the framework of this invention. When arranged in this manner, the said structural members readily expose their retained fastening means 28 for easy and prompt installation of the various junctions J.

Numerous variations in the construction of the collapsible bracket of this invention, in addition to the design of the structural shape or angle used in the formation of numerous components and members of this bracket, within the scope of the appended claims, will occur to those skilled in the art in light of the foregoing disclosure. The description of the preferred embodiment is merely illustrative of this invention, and those modifications that do fall within the scope of the following claims are intended to be protected by any patent to issue hereon.

Having thus described the invention, what is claimed and desired to be secured by Letters Patent is:

1. In a junction support bracket of the type designed for supporting electrical elbows, connectors, terminators, and related electrical equipment comprising a series of vertically arranged frameworks disposing at least frontal and rear electrical equipment mounting surfaces, a pair of spaced apart vertically arranged structural members provided in each framework and providing a space therebetween for mounting of the defined type of electrical equipment, at least one transverse support member forming a mounting surface spanning the distance between each pair of structural members, each transverse support member including structural means for accommodating fastening means for securement of the said type of electrical equipment thereto, there being another space formed between each adjacent frameworks when the bracket is erected, said space being of a dimension to accommodate the convenient arrangement of electric lines therethrough for connection with the aforesaid type of electrical equipment, each forwardmost mounting surface being arranged lower than the mounting surface of the framework therebehind, a series of stringers interconnecting the frameworks together, and said series of frameworks being collapsible towards each other to compact the bracket and facilitate its shipment.

2. In a collapsible junction support bracket of the type designed for supporting electrical elbows, connectors, terminators, and related electrical equipment comprising a series of vertically arranged frameworks disposing at least frontal and rear electrical equipment mounting surfaces, a pair of spaced apart vertically arranged structural members provided in each framework and providing a space therebetween for mounting of the defined type of electrical equipment, at least one transverse support member forming a mounting surface and spanning the distance between each pair of structural members, each forwardmost mounting surface being arranged lower than the mounting surface of the framework therebehind, there being another space formed between each adjacent frameworks when the bracket is erected, and said space being of a dimension to accommodate the convenient arrangement of electrical lines therethrough for connection with the aforesaid type of electrical equipment, a series of stringers interconnecting the frameworks together, said stringers being attached to the sides of each framework and are capable of pivoting with respect thereto for accommodating the said collapse of said bracket, removable braces secured at an incline between adjacent frameworks and designed to fix the space between adjacent frameworks and stabilize the installation of the bracket for usage, said series of frameworks being collapsible towards each other to compact the bracket and facilitate its shipment, each spaced apart structural member of a framework being formed of a structural shape having an integral channel disposing its opening forwardly and having an integral flange extending rearwardly thereof, said channel provided for accommodating fastening means for securement of the said type of electrical equipment to the support bracket.

3. The invention of claim 2 wherein fastening means are provided for cooperating with the integral flanges of the structural members for securing the said stringers and braces thereto.

4. In a junction support bracket of the type designed for supporting electrical elbows, connectors, terminators, and related electrical equipment comprising a series of vertically arranged frameworks disposing at least frontal and rear electrical equipment mounting surfaces, a pair of spaced apart vertically arranged structural members provided in each framework and providing a space therebetween for mounting of the defined type of electrical equipment, at least one transverse support member forming a mounting surface and spanning the distance between each pair of structural members, each transverse support member including a structural angle formed as a channel having its opening facing upwardly thereof and including an integral flange extending downwardly thereof, said channel providing for accommodating bolt means for securement of the said type of electrical equipment thereto, there being another space formed between each adjacent frameworks when the bracket is erected, said space being of a dimension to accommodate the convenient arrangement of electric lines therethrough for connection with the aforesaid type of electrical equipment, each forwardmost mounting surface being arranged lower than the mounting surface of the framework therebehind, a series of stringers interconnecting the frameworks together, and said series of frameworks being collapsible towards each other to compact the bracket and facilitate its shipment.

5. The invention of claim 4 wherein a series of three frameworks are provided in the bracket.

6. In the invention of claim 4, and further including said rear framework being adjustable heightwise to facilitate the shipment and stable installation of said bracket.

\* \* \* \* \*